United States Patent [19]

Shaw

[11] 4,015,282
[45] Mar. 29, 1977

[54] SOLID STATE AMPLIFIER DEVICE AND CIRCUIT THEREFOR

[75] Inventor: Melvin P. Shaw, Southfield, Mich.

[73] Assignee: Energy Conversion Devices, Inc., Troy, Mich.

[22] Filed: Mar. 5, 1976

[21] Appl. No.: 664,260

Related U.S. Application Data

[63] Continuation-in-part of Ser. No. 354,687, April 26, 1973, abandoned.

[52] U.S. Cl. .................................... 357/2; 357/16; 357/34
[51] Int. Cl.² .................................... H01L 45/00
[58] Field of Search .................... 357/2, 34, 16, 57

[56] References Cited

UNITED STATES PATENTS

| | | | |
|---|---|---|---|
| 3,656,032 | 4/1972 | Henisch | 357/2 |
| 3,748,501 | 7/1973 | Fritzsche et al. | 357/2 |
| 3,761,896 | 9/1973 | Davidson | 357/2 |

OTHER PUBLICATIONS

C. Sie, "Memory Cell Using Bistable Resistivity in Amorphous Aa-Te-Ge Film", Thesis at Iowa State University Engineering Research Institute, May, 1969, pp. 1–42.

R. Shaw et al., "New Thin-film Tunnel Triode Using Amorphous Semiconductors", Appl. Phys. Lett., vol. 20 No. 7, Apr. 1972, pp. 241-243.

*Primary Examiner*—Michael J. Lynch
*Assistant Examiner*—Joseph E. Clawson, Jr.
*Attorney, Agent, or Firm*—Wallenstein, Spangenberg, Hattis & Strampel

[57] ABSTRACT

A solid state amplifier device which comprises contiguous layers of material forming emitter, base, and collector electrodes, preferably, the emitter electrode-forming layer being made of a semiconductor switch material which, when a voltage above a given threshold voltage is applied to opposite sides thereof, switches from a relatively non-conductive to a relatively operative conductive state. In one form of the invention providing maximum amplification, the collector electrode and base electrode-forming layers are made of extrinsic semiconductor materials of opposite conductivity type and, in its conductive state, the switch material of the emitter-forming layer is of the same conductivity type as the collector electrode-forming layer to form a transistor-like device. In another form of the invention, to provide a radiation hard amplifier device, the base electrode and collector electrode-forming layers are also made of a semiconductor switch material of the type described.

19 Claims, 7 Drawing Figures

SOLID STATE AMPLIFIER DEVICE AND CIRCUIT THEREFOR

RELATED APPLICATION

This application is a continuation in-part of application Ser. No. 354,687 filed Apr. 26, 1973, now abandoned.

BACKGROUND OF INVENTION

This invention relates to solid state semiconductor electronic control devices having their most advantageous application as current or voltage amplifiers, but which can be used as logic circuit or switch elements, if desired.

More specifically, this invention relates to solid state semiconductor electronic control devices having certain advantages over junction transistors, such as greater amplification levels or minimum adverse affects from ionizing and neutron radiation. Since the electronic control devices of the invention operates on a principle similar to transistors, a brief explanation of transistor operation would be helpful in understanding the different forms of the present invention.

The most common form of solid state amplifier device is the junction transistor which commonly comprises a body of crystalline semiconductor material "doped" or alloyed with impurities which do not combine perfectly with the semiconductor lattice structure. Different regions or layers of the body of semiconductor material are doped with $p$ or $n$ type impurities which, respectively, provide the layers or regions involved with a majority of electrical charge carriers, respectively referred to as holes and electrons. A junction transistor generally has three contiguous layers or regions of doped semiconductor material of alternating type, to form a pnp type transistor or a npn type transistor (the letters $p$ or $n$ designating, respectively, hole and electron supplying impurities in the layer or region of the device involved). The junction between one of the outer layers (referred to as base) is coupled to a source of direct current voltage which forwarded biases the junction between these layers, so as to attract electrical charge carriers constituting the majority carriers of the emitter layer to the latter junction where the electrical charge carriers enter the base layer. The junction between the base and collector layers is generally back-biased by a source of direct current voltage. The thickness of the base layer is critical to the amplification action of a transistor device, and must act as a semiconductor insulator so as not to short circuit the emitter and collector layers and most be sufficiently thin that it is less than what is referred to as the diffusion length of electrical charge carriers therethrough. In other words, the base electrode-forming layer is made sufficiently thin that the electrical charge carriers injected thereinto from the emitter electrode are not neutralized or trapped before reaching the junction between the base and collector electrode-forming layers.

SUMMARY OF THE INVENTION

The present invention is predicated on the discovery that improvements in transistor-like amplifier devices and circuits therefor can be effected by utilizing for at least one of the electrodes, most advantageously the emitter electrode, a material different from the extrinsic semiconductor materials heretofore used, namely a class of materials referred to as semiconductor switching materials, which are most advantageously glassy or amorphous materials like that disclosed in U.S. Pat. No. 3,271,591 to S. R. Ovshinsky, issued Sept. 6, 1969. Semiconductor switching materials are materials which, when a voltage above a given threshold value is applied to opposite sides or spaced portions thereof, switches from a relatively non-conductive state where the material acts like a high resistivity semiconductor (semi-insulator) that is, a material, for example, having resistivities in the range of about $10^3$ to about $10^{12}$ ohm centimeters and higher, to a conductive state where the material acts as a relatively low resistance which is more commonly one having resistivities in the range of from 10 to about $10^{-6}$ ohm centimeters and wherein the voltage thereacross drops to a relatively low value when there is a discrete resistance in series therewith. Semiconductor switching materials particularly useful for the emitter and/or collector electrode-forming layer of the device of invention and having the aforesaid order of resistivities are disclosed in said U.S. Pat. No. 3,271,591. The semiconductor switching materials useful in the invention may be of a type to form what is sometimes referred to as a "threshold switch device" which is a device which, after being driven into its conductive state by a voltage in excess of the aforementioned threshold voltage value, remains in its conductive state until the current flow therethrough drops below a given holding current value. These switching materials are generally vitreous semiconductor materials found among the three-dimensionally cross-linked chalcogenide alloy glasses. Such materials include compositions of (a) 25% (atomic) arsenic and 75% a mixture of 90% tellurium and 10% germanium; (b) 40% tellurium, 35% arsenic, 18% silicon, 6.75% germanium, and 0.25% indium; and (c) 28% tellurium, 34.5% arsenic, 15.5% germanium and 22% sulfur.

Another type of semiconductor switching material useful in the invention forms what is sometimes referred to as a "memory switch device," which is a device which, after being driven into a conductive state by a voltage in excess of a given threshold voltage value, remains in its conductive state even after all sources of energy are removed therefrom, and is resettable back to its relatively non-conductive state by application of a reset pulse, as explained in the aforesaid U.S. Pat. No. 3,271,591. The voltage pulse which sets a memory device-forming material is generally a pulse of milliseconds duration. A reset pulse is a very short current pulse lasting generally less than about 6 microseconds in duration. Memory switch semiconductor materials (disclosed in said U.S. Pat. No. 3,271,591) are vitreous semi-conductor materials which can be changed reversibly between two structural states whose compositions are at the border of the glass regions, and are generally binary compositions of tellurium and germanium with germanium comprising greater than 10% of the composition, or compositions like this including additional elements of group V or VI of the periodic table. Examples of memory material compositions are (a) 15% (atomic) germanium, 81% tellurium, 2% antimony and 2% sulfur; and (b) 83% tellurium and 17% germanium.

In one most advantageous form of the invention, an improved amplifier device is achieved by substituting a semiconductor switching material as described for the emitter layer of a conventional p-n-p or n-p-n junction transistor. Since the semiconductor switching materials especially of the type disclosed in said U.S. Pat. No. 3,271,591 are generally operable in the presence of substantial ionizing and neutron radiation, in another form of the invention, the semiconductor switching materials described are used for the emitter, base and collector layers of the solid state amplifier device where a radiation hard amplifier device is needed, although the amplification capability of such an amplifying device is less than the device where only the emitter electrode is made of such a material. However, in such case, the switching material forming the base layer, if the voltage conditions are such to exceed the threshold value thereof must in its operative conductive state be of a relatively high resistance where it acts like a semiconductor insulator, so the emitter and collectors layers are not short circuited. In any event, when acting as efficient amplifier devices at least the emitter and collector switching material layers should be operated in their conductive states and form with the base layer p-n-p or n-p-n junction devices where at least the emitter and collector layer conduct the majority electrical charge carriers involved to their maximum degree.

The desired initial insulating semiconductor switching material layer or layers are operated in their relatively conductive states by either initially switching the same by application of a source of setting voltage which is independent of the normal amplifying circuit or, most advantageously, by the same voltage sources utilized to provide the proper voltage conditions at the junctions of the amplifier device, as in the case of the junction transistor devices previously described. Thus, the junction between the emitter electrode and base layers would be forwardly biased and the junction between the base and collector electrode layers is back-biased. Circuit configurations corresponding to common base, common emitter or emitter follower can be utilized.

The above and other advantages and features of the invention will become apparent upon making reference to the specification to follow, the claims and the drawings wherein:

DESCRIPTION OF PREFERRED EMBODIMENTS OF INVENTION

Figure 1:
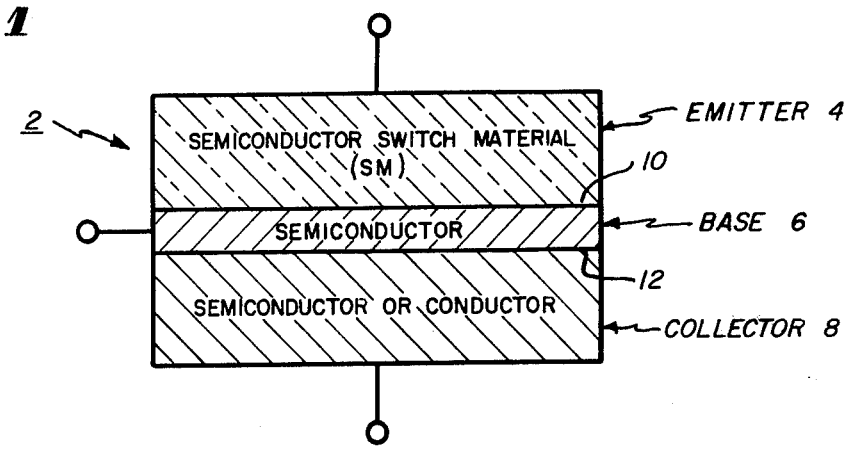
FIG. 1 is a sectional view through the most preferred form of solid state amplifying device of the present invention where at least the emitter electrode is made of a semiconductor switching material and showing the general nature of the base and emitter electrode layers of such a device.

Refer now to FIG. 1 which illustrates a generalized view of a solid state amplifying device of the invention. As there shown, the device identified by reference numeral 2 comprises three superimposed layers 4, 6 and 8 respectively forming emitter, base and collector of a junction transistor-like device where the emitter layer is made of a semiconductor switching material identified by the reference characters SM as previously described. These materials most preferably are chalcogenide glass materials which generally have holes as the dominant carriers, although some of them have electrons as the dominant carriers. (For convenience, the former semiconductor switching materials will be referred to as $p$ type materials and the latter semiconductor switching materials will be referred to as $n$ type even though these materials are not so doped).

The base layer 6 may, in accordance with the broadest aspects of the invention, be formed of a layer of material constituting a semiconductor material which may be a $n$ or $p$ type extrinsic crystalline semiconductor material of opposite conductivity type to the emitter and collector layers 4 and 8, a non-switching amorphous semiconductor material of opposite conductivity type to that of the emitter and collector layers like that disclosed in an article of J. Stuke on page 1–26 of Vol. 4, 1970 edition of the Journal of Non-crystalline solids or a switching amorphous semiconductor material of the memory or threshold type of opposite conductivity type to that of the emitter and collector layers. In the latter, case, the semiconductor switching material would probably be operated in its relatively conductive state, so that it can conduct most efficiently electrical charge carriers through the base layer 6 but, in such case, as previously described, it should have a conductive state impedance which is sufficiently large so that it does not short circuit the junction 10 between the emitter and base electrode layers 6 and 8. Also, the base layer has sufficient thinness and conductivity that it does not substantially trap or neutralize the electrical charge carriers moving from the junction 10 toward the junction 12 before the electrical charge carriers reach the junction 12, as in the case of conventional junction transistors. The collector layer 8 in accordance with the broadest aspect of the invention, can be made of any conductor-forming materials or any suitable semiconductor materials of opposite conductivity type to the base electrode layer. The collector layer should be a relatively good conductor of the electrical charge carriers reaching it through the junction 12. Where a radiation hard device is not needed, the preferred form of the invention has an emitter layer of a semiconductor switching material as described, and base and collector layers of a doped crystalline semiconductor material. If radiation hard characteristics are desired, the emitter, base and collector layers are made of amorphous switching or non-switching semiconductor materials which respectively alternate in conductivity type.

Figure 2:
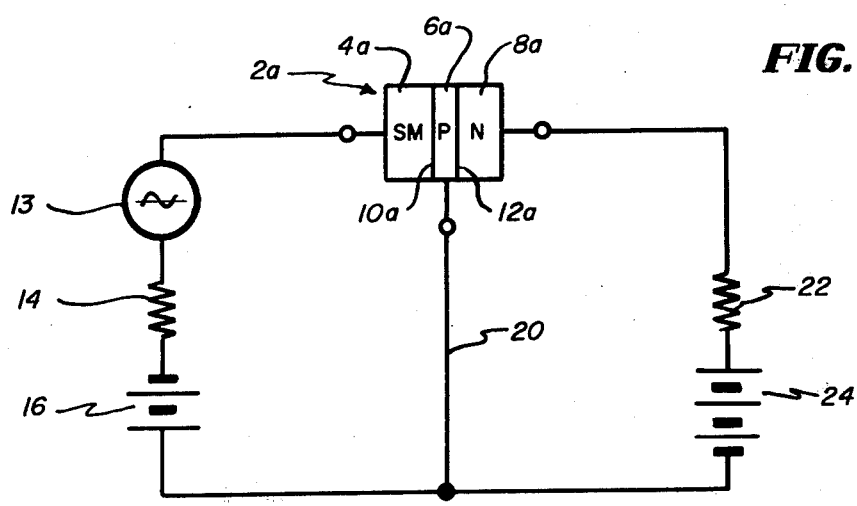
FIG. 2 illustrates an amplifying circuit utilizing a solid state amplifier device of the invention where the base and collector electrodes are respectively $p$ and $n$ type extrinsic semiconductor materials and the circuit configuration is a common base configuration.

Refer now to FIG. 2 where a common base circuit configuration os shown utilizing a solid state amplifying device 2a with various voltage and signal sources forming an amplifier circuit. The solid state amplifying device 2a has an emitter layer 4a comprising a semiconductor switching material as described, a base layer 6a formed by a doped p type extrinsic semiconductor material and a collector layer 8a comprising doped n type extrinsic semiconductor material. Although the circuitry shown may vary widely, as illustrated, a source of signals 13 to be amplified is shown connected between the emitter electrode layer 4a of the amplifying device 2a and a current limiting resistor 14, in turn, connected to the negative terminal of the source of direct current voltage 16. The positive terminal of the source of direct current voltage 16 is connected to ground as is the base electrode layer 6a so that the junction 10a between the emitter and base layers 4a and 6a is forwardly biased so the electrical charge carrier moving from the emitter to the base layer is complementary to the majority charge carriers of the base layer. The magnitude of the output of the source of direct current voltage 16 may vary widely. For purposes of illustration, it will be assumed to be of a magnitude typical of that used with any commercially available transistor of the NPN type where the base and collector layers 6a and 8a have the same parameters as the base and collector layers thereof.

The emitter layer 4a made of a semiconductor switching material may be deposited by sputtering or vapor deposition on the base layer 6a with a thickness such that the magnitude of the output of the source of direct current voltage 16 substantially exceeds the threshold voltage value of the semiconductor switching material forming the emitter layer. As is well known, the threshold voltage level of a semiconductor switching material of the kind described varies with the thickness of the deposited layer. The base and emitter layers 6a and 8a may be constructed, for example, in the same manner as the base and emitter layers in any common available junction transistor.

In FIG. 2, a load resistor 22 is shown connected between the collector layer 8a and the positive terminal of a source of direct current voltage 24. The negative terminal of the source of direct current voltage 24 is connected to ground so that the junction 12a between the base and electrode layers is back biased to accelerate the electrical charge carriers of the emitter layer reaching the same.

Figure 3:
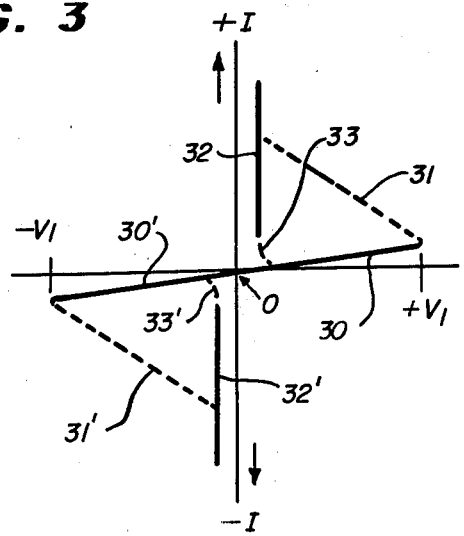
FIG. 3 illustrates the voltage-current characteristic of the emitter electrode-forming layer of the solid state amplifying devices shown in FIGS. 1 and 2.

The semiconductor switching material of the emitter electrode layer 4a when adjacent a p type base electrode layer is at least in its conductive state a seminconductor including electrons as the majority carriers characteristic of an n conductively type material. (Some semiconductor switch materials have different majority carriers in their relatively conductive and non-conductive states.) The manner in which this semiconductor switching material layer 6a operates when a voltage is applied thereto is illustrated by the voltage-current curves of FIG. 3. With the semiconductor switching material in its non-conductive state, as a voltage of either polarity applied to the opposite sides thereof is gradually increased from zero, the relatively high resistance of at least portions or paths of the semiconductor switching material results in a very small gradually increasing current, as indicated by curve portion 30 or 30'. When the voltage applied increases to a value ± $V_1$ corresponding to the voltage threshold value of the device, said at least portions or paths of the semiconductor switching material (at last one path or filament or thread) are substantially instantaneously changed to a low resistance or conducting state for conducting current therethrough. The substantially instantaneous switching of said at least portions or paths of the semiconductor switching material from their high resistance non-conductive state to their low resistance conductive state is depicted by the dotted curve portion 31 or 31'. The switching time for switching from the non-conducting state to the conducting state is extremely short, substantially instantaneous, although a short time delay is usually involved in setting the substantially instantaneous switching. The conducting condition of the semiconductor switching material is illustrated by the curve portion 32 or 32'. When the applied voltage is lowered to a value to decrease the current to a value below a minimum current holding value, the low resistance conductin condition follows substantially the curve portion 33 or 33' and immediately causes switching to the high resistance or blocking condition. The semiconductor switching material will remain in its nonconductive state until switched to its conductive state by the application of a threshold voltage as described above. The voltage current characteristics are not shown to scale in FIG. 3, but are merely illustrated, for the ratio of blocking resistance to the resistance in the conductive state is usually larger than 100,000:1. In its low resistance or conductive state, the resistance for emitter or collector-forming layers may be as low as about 1–10 ohms as determined by the small voltage drop thereacross and, also, the holding current may be very small, that is near zero.

Returning now to the amplifier circuit of FIG. 2, the output of the source of direct current voltage 16 prefereably is selected substantially to exceed the threshold voltage value of the semiconductor switching material forming the emitter layer 4a and the non-conductive resistance of the emitter layer is greatly in excess of the resistance of the resistor 14 and the base layer, so substantially the entire output of direct current voltage source appears across the emitter layer so the layer 4a will be driven to its relatively conductive state. Substantial amounts of electrical charge carriers in the form of electrons will then be attracted to the junction 10a at the interface between the emitter and base layers. A source of signals 13 to be amplified is connected has an output whose amplitude will be assumed to be less than the output of the source of direct current voltage 16, so that the amplifier will be operated linearly and current flow through the emitter electrode layer 4a will at no time go below a near zero holding current level. If the emitter layer 4a were to be driven into a non-conductive state by the signal source 13, this would create distortions in the amplifying action of the solid state amplifier device, although it would immediately be switched to its conductive state as the output of the signal source 13 begins to be in additive relationship to the direct current voltage in series with resistor 14 and direct current voltage source 16.

Figure 4:
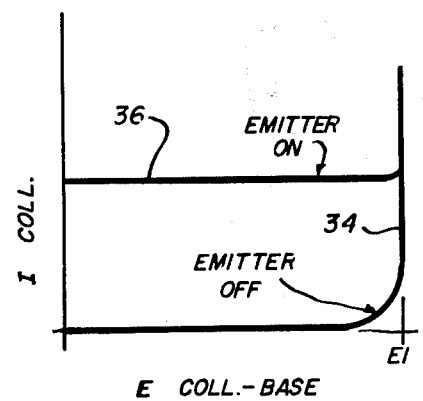
FIG. 4 shows collector-current-base voltage curves for the solid state amplifying device shown in FIG. 2 for the circumstances where the emitter layer thereof is in its relatively conductive and non-conductive state.

If the voltage conditions between the emitter layer 4a and the base layer 6a are insufficient to drive the layer 4a into its conductive state, curve 34 in FIG. 4 illustrates the variation in collector current with variation in the magnitude of the output of the source of direct current voltage 24. As thereshown, there is very little collector current until an abnormal voltage magnitude E1 is reached. On the other hand, when the emitter electrode layer 4a is switched to its conductive state, as shown by curve 36, appreciable collector current flows in the normal operation of the device.

As in the case of conventional transistors, the base electrode layer 6a is sufficiently thin that electrical charge carriers passing between junctions 10a and 12a do not become substantially entrapped or neutralized before reaching the junction 12a. Enhanced amplification action results due to the rather high electrical charge carrier efficiency of the semiconductor switching amterial forming the emitter electrode layer 4a.

Figure 5:
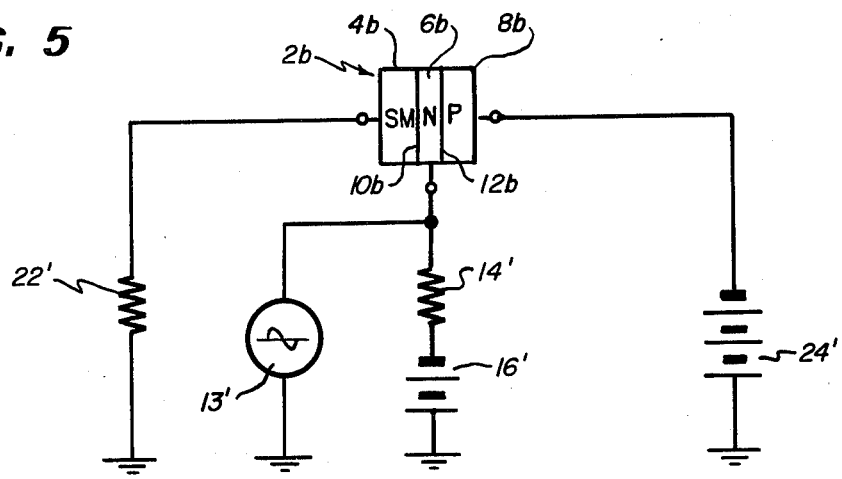
FIG. 5 illustrates an amplifier circuit utilizing a solid state amplifying device of the invention where the base and emitter layers are respectively $n$ and $p$ type extrinsic semiconductor materials and the circuit configuration is an emitter follower configuration.

Refer now to FIG. 5 which illustrates an amplifier circuit using a solid state amplifier device 2b like the device 2a in FIG. 2, except that the circuit uses voltage sources and resistors connected to form an emitter-follower circuit as an example of an alternative circuit configuration. Also, the semiconductor switching material of the emitter electrode layer 4b is is a p or hole supplying type. A load resistor 22' is shown connected between the emitter electrode layer 4b and ground. The negative terminal of a source of direct current voltage 24' is connected to a p type crystalline semiconductor collector layer 8b, the positive terminal thereof being grounded, and a current limiting resistor 14' is connected between an n type crystalline semiconductor base layer 6b and the negative terminal of a source of direct current voltage 16' whose positive terminal is grounded. A source of signal voltage 13' is connected between the base layer 6b and ground. It should be noted that the direct current voltage sources 16' and 24' are connected so as to forwardly bias the junction 10b between the emitter and base layers 4b and 6b and back bias the junction 12b between the base and collector layers 6b and 8b. (This requires the magnitude of the output of the voltage source 24' to exceed the output of voltage source 16'.)

Figure 6:
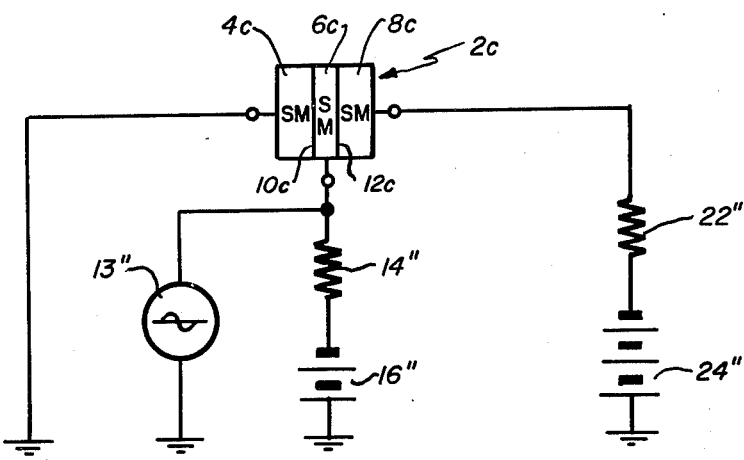
FIG. 6 is an amplifier circuit including a solid state amplifying device of the invention wherein the three layers of the device all comprise semiconductor switching materials and the circuit configuration is a common emitter configuration.

Refer now to FIG. 6 where a common emitter base circuit configuration is shown utilizing a solid state amplifier device 2c wherein the emitter, base and collector layers 4c, 6c and 8c are all made of amorphous materials, preferably semiconductor switching materials as described, which alternate in conductivity types and the voltage sources and resistors are connected to the solid state amplifier device 2c in common emitter configuration. Thus, a load resistor 22'' is connected between the collector layer 8c and the negative terminal of a source of direct current voltage 24'' whose positive terminal is connected to ground. The emitter electrode layer 4c is also connected to ground. The base layer 6c is connected through a current limiting resistor 14'' to the negative terminal of a source of direct current voltage 16'' whose positive terminal is grounded. The source of direct current voltage 16'' and 24'' are connected to the layers of the solid state current control device 2c in a manner such that the junction 10c between the emitter and base layers is forwardly biased and the junction 12c between the base and collector layers is back biased. A source of signal voltage 13'' is shown connected between the base layer 6c and ground.

The circuit of FIG. 6 has the advantage over the previously described circuits in that all the layers of the solid state amplifier device 2c are made of amorphous material which, unlike crystalline extrinsic semiconductor materials, are radiation hard, so the circuit can operate effectively in the presence of ioizing and neutron radiation.

Figure 7:
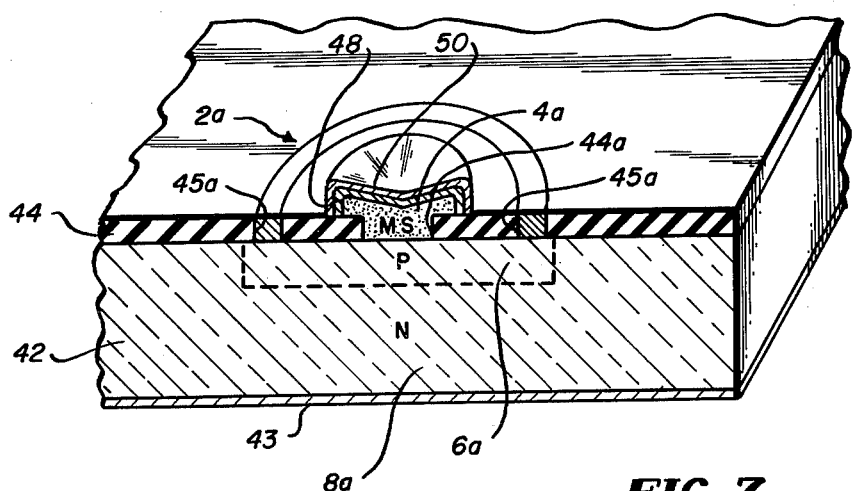
FIG. 7 illustrates a perspective and sectional view of an exemplary construction of the type of solid state amplifying device diagrammatically shown in FIG. 2.

Refer now to FIG. 7 which illustrates an exemplary construction for the solid state amplifier device 2a shown in FIG. 2. As thereshown, the solid state amplifier device 2a includes a semiconductor substrate body 42 made of n conductivity type semiconductor material. The bottom face of the substrate body 42 is shown coated with a suitable metallic electrode 43 constituting one of the terminals of the solid state amplifier device 2a. A limited portion of the upper section of the substrate body 42 is doped to form a p conductivity region forming the thin base electrode layer 6a in accordance with well known transistor making techniques. The substrate body 42 has a film or layer 44 of oxidized silicon or other insulation material having an opening 44a centered on the p conductivity region forming the base electrode layer 6a. The insulation film 44 also has an annular opening 45a exposing the peripheral regions of the base forming region 6a. The annular opening 45a is filled with a suitable conductor-forming metal, such as aluminum, to form a terminal connection to the base layer 6a of the solid state amplifier device 2a.

Deposited in any suitable way within the opening 44a in the insulating film 44 is a layer of semiconductor switching material as previously described, which forms the emitter layer 4a. The emitter layer 4a is shown deposited upon a portion of the insulating film 44 and extends into the insulating film opening 44a to make direct contact with the upper face of the base layer 6a. A layer of an amorphous refractory metal 48, such as molybdenum, covers the semiconductor switching material forming the emitter layer 4a, to isolate the same from a conductor-forming layer 50 of aluminum or the like constituting a connecting terminal for the emitter layer 4a.

It should be understood that numerous modifications may be made in the preferred forms of the invention described and shown in the drawings without deviating from the broader aspects of the invention.

I claim:

1. A solid state current control device comprising: contiguous interfacing layers of material of alternating conductivity type to form one of a pnp and npn device transistor-like device with emitter, base and collector layer with transistor junctions at their interfaces in the order named, terminal-forming layers for making electrical connection to the emitter and collector layers and terminal means for making electrical connection to said base layer, at least one of the emitter and collector layers being made of a switch material which, when a voltage above a given threshold value is applied to opposite sides thereof, switches from a relatively non-conductive state to a relatively conductive state which is of an opposite conductivity type to that of the base layer at least in the conductive state thereof, substantially decreases from the threshold value when a finite resistance is connected in series therewith, the collector layer being of a material which collects electrical charge carriers directed thereto through the base layer, and said base layer always being of sufficiently high resistance not to short circuit the junction between it and the adjacent layers and being of a thinness to be less than the diffusion length of electrical charge carriers therethrough so the majority carriers of the emitter layer are not substantially neutralized or trapped before reaching the junction between the base and collector layers.

2. The solid state current control device of claim 1 wherein said at least one layer is the emitter forming layer.

3. The solid state current control device of claim 1 wherein said base and collector layers are also formed of a switch material which, when a voltage above a given threshold value is applied to opposite sides thereof, switches from a relatively non-conductive state to a relatively conductive state and the voltage thereacross substantially decreases from said threshold value when a finite resistance is connected in series therewith.

4. The solid state control device of claim 1 wherein two contiguous ones of said layers are extrinsic semiconductor materials.

5. The solid state current control device of claim 1 wherein said base layer is an extrinsic semiconductor material.

6. The solid state current control device of clam 1 combined with voltage source means coupled to the emitter, base and collector layers of the device for biasing the emitter-collector junction to provide for the movement of the majority charge carriers of the emitter to the emitter-base layer junction, and to provide at the base and collector junction of the device a voltage which accelerates thereto the majority charge carriers supplied by said emitter layer.

7. The solid state current control device of claim 1 wherein said emitter, base and collector layers are amorphous radiation hard materials.

8. The combination of claim 6 wherein said voltage source means supply a DC voltage which causes the said switch material layer to switch to said conductive state so it normally operates in said operative state.

9. The combination of claim 6 combined with a solid state electronic control device comprising load impedance means and circuit-forming means interconnecting said voltage sources, and emitter, base and collector layers of the current control device for forming one of a common base, common emitter and emitter follower circuit configuration.

10. The combination of claim 9 wherein all of said layers are formed of a switch material which, when a voltage above a given threshold value is applied to opposite sides thereof, switches from a relatively non-conductive state to an relatively conductive state and the voltage thereacross substantially decreases from the threshold value when a finite resistance is connected in series therethrough, and the magnitude of the output of said voltage source means connected to said layers is sufficient to provide voltage conditions thereat initially in excess of said threshold values thereof to effect operation thereof in said relatively conductive states.

11. The solid state current control device of claim 1 wherein said switch-forming material is a semiconductor material which, when a voltage in excess of a given threshold voltage is applied thereto, switches the same from a relatively high to a relatively low resistance condition and returns to a high resistance condition when the current flow therethrough drops below a holding current level.

12. The solid state control device of claim 1 wherein said switch-forming material is a memory semiconductor material which, when a voltage in excess of a given threshold voltage is applied thereto, switches the same from a relatively high to a relatively low resistance condition, which high resistance condition remains even after all sources of voltage and current are disconnected therefrom.

13. The solid state control device of claim 1 wherein said semiconductor switch material is a chalcogenide semiconductor material.

14. The combination of claim 6 wherein the circuit defined therein forms a signal amplifier and there is provided a source of signals to be amplified coupled between the emitter and collector-forming layers of said control device which is of an amplitude not to override the effect of said volage source means to maintain said switch material layer in said conductive state.

15. The solid state current control device of claim 1 wherein only one of said layers is made of said switch material.

16. The solid state current control device of claim 1 wherein said switch material is a memory switch material which remains in its switched conductive state even after all sources of energy are removed therefrom.

17. The solid state current control device of claim 1 wherein said switch material is a threshold switch material which remains in its switched conductive state until the current therethrough drops below a given holding current level.

18. A solid state current control device comprising: contiguous interfacing layers of semiconductor material of alternating conductivity type to form one of a pnp and npn transistor-like device with emitter, base and collector layers with transistor junctions at their interfaces in the order named, the emitter layer being made of a switch material which, when a voltage above a given threshold value is applied to the opposite sides thereof, switches from a relatively non-conductive state to a relatively conductive state which is of an opposite conductivity type of that of the base layer at least in the conductive state thereof, and the voltage thereacross substantially decreases from the threshold value when a finite resistance is connected in series therewith, the collector layer being of a material which collects electrical charge carriers directed thereto through the base layer, and said base layer always being of sufficiently high resistance not to short circuit the junction between it and the adjacent layers and being of a thinness to be less than the diffusion length of electrical charge carriers therethrough so the majority carriers of the emitter layer are not substantially neutralized or trapped before reaching the junction between the base and collector layers, and three device connection points respectively at said contiguous layers of material forming said emitter, base and collector layers for connecting the same to circuit forming elements.

19. A solid state current control device comprising: contiguous interfacing layers of semiconductor material of alternating conductivity type to form one of a pnp and npn transistor-like device with emitter, base and collector layers with transistor junctions at their interfaces in the order named, at least said base layer and one of the other layers being respectively made of extrinsic semiconductor material, the emitter layer being made of a switch material which, when a voltage above a given threshold value is applied to opposite sides thereof, switches from a relatively non-conductive state to a relatively conductive state which is of an opposite conductivity type to that of the base layer at least in the conductive state thereof, and the voltage thereacross substantially decreases from the threshold value when a finite resistance is connected in series therewith, and said base layer always being of sufficiently high resistance not to short circuit the junction between it and the adjacent layers and being of a thinness to be less than the diffusion length of electrical charge carriers therethrough so the majority carriers of the emitter layer are not substantially neutralized or trapped before reaching the junction between the base and collector layers, and three device connection points respectively at said contiguous layers of material forming said emitter, base and collector layers for connecting the same to circuit forming elements.

* * * * *